United States Patent
Schleicher et al.

(10) Patent No.: US 7,119,575 B1
(45) Date of Patent: Oct. 10, 2006

(54) LOGIC CELL WITH IMPROVED MULTIPLEXER, BARREL SHIFTER, AND CROSSBARRING EFFICIENCY

(75) Inventors: James Schleicher, Santa Clara, CA (US); Bruce Pedersen, Sunnyvale, CA (US); Sinan Kaptanoglu, Belmont, CA (US)

(73) Assignee: Altera Corporation, San Jose, CA (US)

( * ) Notice: Subject to any disclaimer, the term of this patent is extended or adjusted under 35 U.S.C. 154(b) by 145 days.

(21) Appl. No.: 10/756,206

(22) Filed: Jan. 12, 2004

(51) Int. Cl.
*H03K 19/177* (2006.01)
(52) U.S. Cl. .......................................... 326/41; 326/38
(58) Field of Classification Search ............ 326/38–41, 326/47
See application file for complete search history.

(56) References Cited

U.S. PATENT DOCUMENTS 6,262,597 B1 * 7/2001 Bauer et al. ................... 326/41
6,292,019 B1 * 9/2001 New et al. ..................... 326/41
6,798,240 B1 * 9/2004 Pedersen ....................... 326/39

OTHER PUBLICATIONS

Lewis et al., U.S. Appl. No. 10/364,310 filed Feb. 10, 2003.
Pedersen et al. U.S. Appl. No. 10/351,026 filed Jan. 24, 2003.

* cited by examiner

*Primary Examiner*—James H. Cho
(74) *Attorney, Agent, or Firm*—Beyer Weaver & Thomas, LLP

(57) ABSTRACT

Logic circuits that provide improved efficiency are described. In one general embodiment, this is accomplished by feeding outputs of LEs in the logic circuit to multiplexers that receive their select signals from input terminals of the LEs in the logic circuit. In one embodiment, each of the LEs provides one output signal. The first LE in the logic circuit provides an output signal to one multiplexer, while each of the remaining LEs in the logic circuit provides an output signal to two multiplexers. In another embodiment, each of the LEs provides two output signals. The first LE in the logic circuit provides two output signals to one multiplexer, while each of the remaining LEs in the logic circuit provides two output signals to four multiplexers.

23 Claims, 4 Drawing Sheets

LOGIC CELL WITH IMPROVED MULTIPLEXER, BARREL SHIFTER, AND CROSSBARRING EFFICIENCY

BACKGROUND OF THE INVENTION

Programmable logic devices ("PLDs") (also sometimes referred to as complex PLDs ("CPLDs"), programmable array logic ("PALs"), programmable logic arrays ("PLAs"), field PLAs ("FPLAs"), erasable PLDs ("EPLDs"), electrically erasable PLDs ("EEPLDs"), logic cell arrays ("LCAs"), field programmable gate arrays ("FPGAs"), or by other names), are well-known integrated circuits that provide the advantages of fixed integrated circuits with the flexibility of custom integrated circuits. Such devices typically provide an "off the shelf" device having at least a portion that can be programmed to meet a user's specific needs. Application specific integrated circuits ("ASICs") have traditionally been fixed integrated circuits. However, it is possible to provide an ASIC that has a portion or portions that are programmable. Thus, it is possible for an integrated circuit device to have qualities of both an ASIC and a PLD. The term PLD as used herein will be considered broad enough to include such devices.

PLDs have configuration elements that may be programmed or reprogrammed. Configuration elements may be realized as random access memory ("RAM") bits, flip-flops, electronically erasable programmable read-only memory ("EEPROM") cells, or other memory elements. Placing new data into the configuration elements programs or reprograms the PLD's logic functions and associated routing pathways. Configuration elements that are field programmable are often implemented as RAM cells (sometimes referred to a "configuration RAM" ("CRAM")). However, many types of configurable elements may be used including static or dynamic RAM ("SRAM" or "DRAM"), electrically erasable read-only memory ("EEROM"), flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by other PLD elements.

PLDs typically include blocks of logic elements, sometimes referred to as logic array blocks ("LABs"; also referred to by other names, e.g., "configurable logic blocks" ("CLBs")). Typically, the basic functional block of a LAB is a logic element ("LE") that is capable of performing logic functions on a number of input variables. LEs, which are sometimes referred to by other names, e.g., "logic cells", may include a look-up table (LUT) or product term, carry-out chain, register, and other elements. PLDs typically combine together large numbers of such LEs through an array of programmable interconnects to facilitate implementation of complex logic functions. LABs (comprising multiple LEs) may be connected to horizontal and vertical conductors that may or may not extend the length of the PLD.

A LE is sometimes used to perform a multiplexing function on its data input variables. In many cases, the LUT within a LE performs the multiplexing function. The number of data input variables on which multiplexing may be performed is determined by the number of input terminals of the LUT. The sum of the number of data input variables to be multiplexed and the number of select signals necessary for selecting from among the data input variables must be less than or equal to the number of input terminals of the LUT. There are a number of known ways of increasing the number of data input variables that are multiplexed. In one method, LEs are coupled in series. In other words, the outputs of a first stage of LEs are fed into a second stage of LEs. More specifically, the outputs of LUTs in the first stage of LEs are fed into the LUTs in the second stage of LEs, where both the first stage LUTs and second stage LUTs perform a multiplexing function on their respective data input variables. In another method, the outputs of multiple LEs (or LUTs therein) which perform a multiplexing function on their data input variables are fed into hardwired multiplexer(s).

Another function performed by LEs is barrel shifting. Those skilled in the art know that barrel shifting is the process of shifting data input signals by a number of bits depending on select signals that determine the extent of the shift. Those skilled in the art also know that there are generally two types of barrel shifting. In one type of barrel shifting, N data bits (where N is an integer) are shifted down by m bits and the top m bits (where m is an integer less than or equal to N) are all replaced by binary low signals, i.e., zeros, or by binary high signals, i.e., ones. For example, data input signals on input terminals 1 to 16, may be shifted by 5 bits such that input data "abcdefghijklmnop" is barrel shifted and "00000abcdefghijk" is output. In another type of barrel shifting (sometimes referred to as rotating barrel shifting), the shifted out data is placed at the top of the data stream. For example in a rotating barrel shifting process, a 5 bit shift of "abcdefghijklmnop" results in "lmnopabcdefghijk".

Yet another function performed by LEs is crossbarring of input data. Crossbarring is a more general case of barrel shifting. In barrel shifting, both the input data and the select signals are the same. On the other hand, in the case of crossbarring, the input data are the same, but the select signals are different. In other words, the same input data are selected using different sets of select signals as a result of which different subsets of input data are selected.

Some known methods for implementing one or more of multiplexers, barrel shifters, and crossbars suffer from inefficiencies in the number of LEs required and/or the number of levels of LEs required to perform the desired function. The number of LEs required to perform the function is at times referred to as the LE density. The number of levels of LEs required to perform the function is at times referred to as the depth of the logic circuit. The depth of the logic circuit affects the speed with which the logic circuit performs its intended functions. Generally, all else being equal, logic circuits with lower depth perform functions faster than those with higher depth. As used herein, improved logic circuit efficiency refers to improved density (i.e., lower density) and/or improved depth (i.e., lower depth).

The present invention is directed to improving the efficiency of logic circuits for implementing one or more of multiplexers, barrel shifters, and crossbars, and to improve the consistency of delay through the multiplexing structure of the logic circuit with minimum impact on the routing algorithms of the PLD of which the logic circuit is a part.

SUMMARY OF THE INVENTION

In one aspect, an embodiment of the present invention provides a logic circuit that provides more efficient multiplexing and barrel shifting than a prior art logic circuit. In one general embodiment, this is accomplished by feeding outputs of LEs in the logic circuit to multiplexers that receive their select signals from input terminals of the LEs in the logic circuit. In one embodiment, each of the LEs provides one output signal. The first LE in the logic circuit provides an output signal to one multiplexer, while each of the remaining LEs in the logic circuit provides an output signal to two multiplexers. In one embodiment, each of the LEs is an eight input LE that includes a six input LUT that functions as a 4:1 multiplexer, and each of the multiplexers is a 2:1 multiplexer. Use of LUTs that can function as 4:1 multiplexers allows for achieving the intended multiplexing function with lower depth than would be required when using LUTs that can function only as multiplexers smaller than 4:1 multiplexers. In another embodiment, each of the LEs provides two output signals. The first LE in the logic circuit provides two output signals to one multiplexer, while each of the remaining LEs in the logic circuit provides two output signals to four multiplexers. In one embodiment, each of the LEs is an eight input LE that includes two four input LUTs each of which acts as a 2:1 multiplexer, and each of the multiplexers is a 2:1 multiplexer.

In another aspect, an embodiment of the present invention provides a logic circuit that is particularly efficient in cross-barring and barrel shifting data input signals. In this embodiment, the logic circuit includes a plurality of LEs, where each of the LEs uses a shared LUT mask (SLM) and multiplexes the data input signals using two different sets of select signals. In this embodiment, the logic circuit also includes a plurality of multiplexers. Each of these multiplexers receives output signals from two of the LUTs and multiplexes the output signals. A first set of the multiplexers is coupled to a first select signal line from which each of the multiplexers in the first set receives a first select signal. A second set of the multiplexers is coupled to a second select signal line from which each of the multiplexers in the second set receives a second select signal. In one embodiment, each of the LEs is an eight input LE and includes a 6-input LUT. In one embodiment, each of the 6-input LUTs provides two separate 4:1 multiplexing results. In one embodiment, the first and second select signal lines are LAB-wide select signal lines. In other words, all the logic circuits in a LAB use the same select signal lines.

BRIEF DESCRIPTION OF THE DRAWINGS

The novel features of the invention are set forth in the appended claims. However, for purpose of explanation, several aspects of a particular embodiment of the invention are described by reference to the following figures.

DETAILED DESCRIPTION OF THE INVENTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
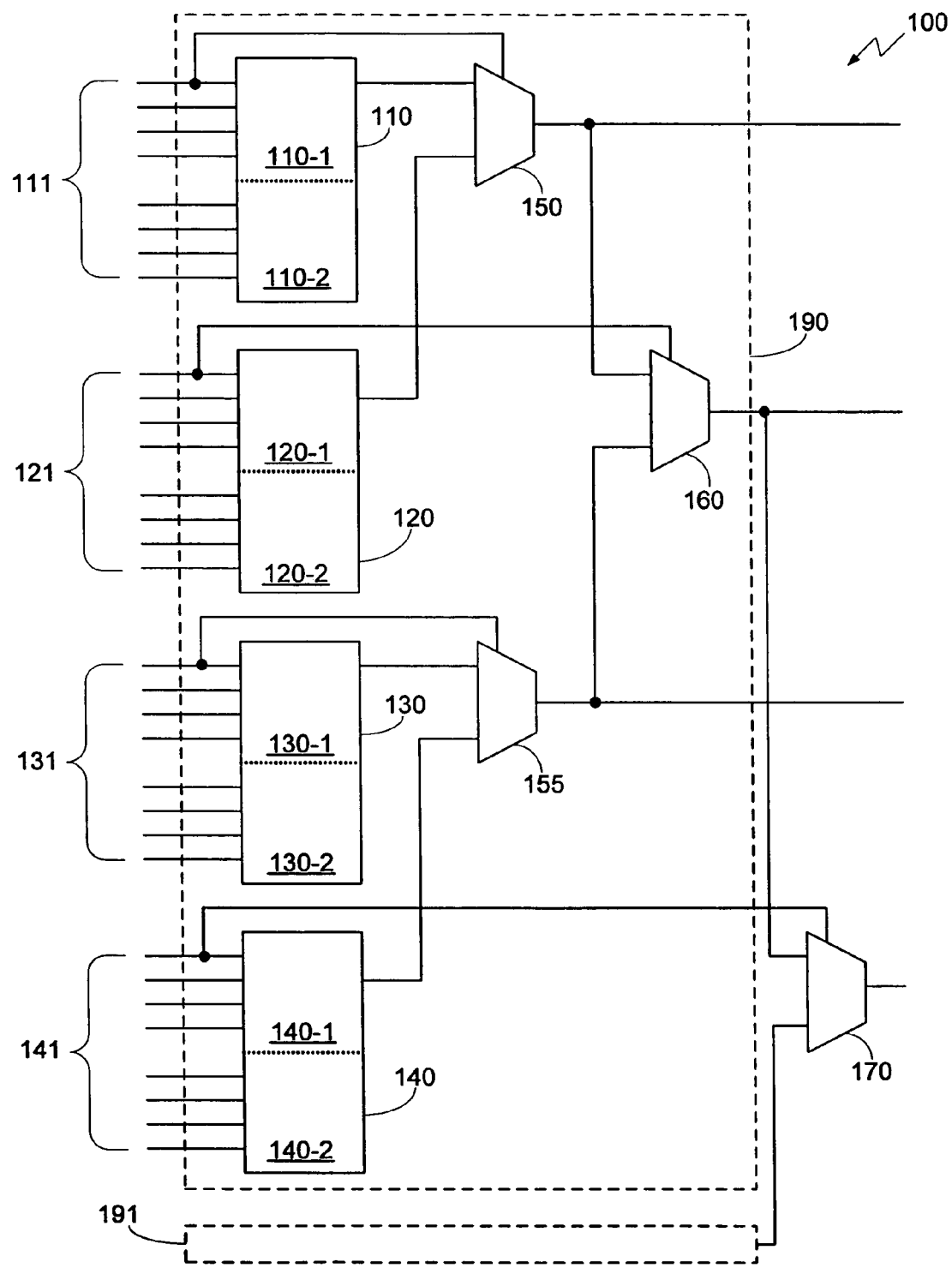
FIG. 1 is a block diagram of one embodiment of the logic circuit of the present invention.

FIG. 1 is a block diagram of one embodiment of the logic circuit of the present invention. In FIG. 1, logic circuit 100 includes logic blocks 190 and 191 and multiplexer 170. Logic block 190 includes LEs 110, 120, 130, and 140, and multiplexers 150, 155, and 160. LEs 110, 120, 130, and 140 receive signals on LE input terminals 111, 121, 131, and 141, respectively. With the following exception, logic block 191 is identical to logic block 190. Therefore, details of logic block 191 are not shown in order to avoid unduly complicating FIG. 1. In logic block 191, the LE (not shown) that corresponds to LE 140 in logic block 190 does not include an LE input terminal coupled to the select terminal of multiplexer 170. An output terminal of each of logic blocks 190 and 191 is coupled to multiplexer 170. In one embodiment, each of LEs 110, 120, 130, and 140 includes eight LE input terminals. Also, in one embodiment, each of multiplexers 150, 155, 160, and 170 is a 2:1 multiplexer.

In one embodiment each of LEs 110, 120, 130, and 140 includes a 6-input LUT that is fracturable. In other words, each 6-input LUT includes smaller LUTs. In one embodiment, each 6-input LUT includes two 5-input LUTs. Each of the 5-input LUTs in turn includes two 4-input LUTs. In FIG. 1, two of the 4-input LUTs included in LE 110 are represented by reference numbers 110-1 and 110-2. Similarly, two of the 4-input LUTs included in LE 120 are represented by reference numbers 120-1 and 120-2, two of the 4-input LUTs included in LE 130 are represented by reference numbers 130-1 and 130-2, and two of the 4-input LUTs includes in LE 140 are represented by reference numbers 140-1 and 140-2. A fracturable LUT is described in greater detail in U.S. patent application Ser. No. 10/364,310, which was filed on Feb. 10, 2003, is entitled "Fracturable Lookup Table And Logic Element", and is incorporated herein by reference in its entirety.

In one embodiment, when each of LEs 110, 120, 130, and 140 includes a 6-input LUT, each of LEs 110, 120, 130, and 140 functions as a 4:1 multiplexer using the 6-input LUT therein. Thus, each of LEs 110, 120, 130, and 140 outputs the result of 4:1 multiplexing of the input data signals that it receives on input terminals 111, 121, 131, and 141, respectively.

When each of LEs 110, 120, 130, and 140 functions as one 4:1 multiplexer, for each of LEs 110, 120, 130, and 140, four input terminals receive data input signals to be multiplexed, while two other input terminals receive select signals for selecting one of the four data input signals. The other remaining two input terminals may receive other signals. In the embodiment shown in FIG. 1, one of the remaining input terminals receives a select signal for a 2:1 multiplexer. As shown in FIG. 1, each of multiplexers 150, 155, 160, and 170 receives a select signal from an input terminal of LEs 110, 120, 130, and 140, respectively. In one embodiment, each of the select terminals of multiplexers 150, 155, 160, and 170 is hardwired to an input terminal of LEs 110, 120, 130, and 140, respectively.

As noted above, in one embodiment, each of each of LEs 110, 120, 130, and 140 functions as a 4:1 multiplexer. Multiplexer 150 receives input data signals from LEs 10 and 120 and outputs one signal in response. Thus, multiplexer 150 in conjunction with LEs 110 and 120 acts as an 8:1 multiplexer and provides the result of an 8:1 multiplexing of the data input signals received at input terminals 111 and 121 of LEs 110 and 120. Multiplexer 155 receives input data signals from LEs 130 and 140 and outputs one signal in response. Thus, multiplexer 155 in conjunction with LEs 130 and 140 acts as an 8:1 multiplexer and provides the result of an 8:1 multiplexing of the data input signals received at input terminals 131 and 141 of LEs 130 and 140. Multiplexer 160 receives input data signals from multiplexers 150 and 155. Thus, multiplexer 160 in conjunction with LEs 110, 120, 130, and 140 and multiplexers 150 and 155 acts as a 16:1 multiplexer and provides the result of a 16:1 multiplexing of the data input signals received at input terminals 111, 121, 131, and 141 of LEs 110, 120, 130, and 140. Multiplexer 170 receives input data signals from multiplexer 160 and another 16:1 multiplexer (not shown) in logic block 191. This other 16:1 multiplexer is coupled to respective 2:1 multiplexers and LEs in a manner similar to the coupling of multiplexer 160 to multiplexers 150 and 155 and LEs 110, 120, 130, and 140. As multiplexer 170 receives two 16:1 multiplexing results and provides the multiplexing result thereof, it provides a 32:1 multiplexing result. The 32:1 multiplexing result is the result of 32:1 multiplexing of the input data signals received at input terminals 111, 121, 131, and 141 of LEs 110, 120, 130, and 140 in logic block 190 and at input terminals of another set of four LEs, like LEs 110, 120, 130, and 140, included in logic block 191.

As explained above, logic circuit 100 provides a 32:1 multiplexing result. With additional LEs and multiplexers, logic circuit 100 may function as a larger multiplexer, e.g., as a 64:1 or 128:1 multiplexer. For example to obtain a 64:1 multiplexer, the output of multiplexer 170 and that of another similarly situated multiplexer (not shown) that provides a 32:1 output would be provided to a 2:1 multiplexer (not shown) which in turn would output a 64:1 multiplexing result.

In the embodiment shown in FIG. 1, each of LEs 110, 120, 130, and 140 provides a 4:1 multiplexing result. In another embodiment, the LEs may provide an N:1 multiplexing result, where N is an integer equal to or greater than 2. In such an embodiment, the outputs of LEs and multiplexers would provide a correspondingly different multiplexing result.

Logic circuit 100 provides four 8:1 multiplexing results, two 16:1 multiplexing results, and one 32:1 multiplexing results in one level of logic, i.e., by having the signals go through only one level of LEs. It is to be noted that logic circuit 100 provides these multiplexing capabilities without using general routing other than the normal routing for LE inputs. This is an improvement over other circuits that either use additional routing or have greater depth. Furthermore, in logic circuit 100, there is one 2:1 multiplexer per each LE. As such, logic circuit 100 is more efficient, in terms of density, than similar circuits that use a larger number of hardwired multiplexers per LE.

Figure 2:
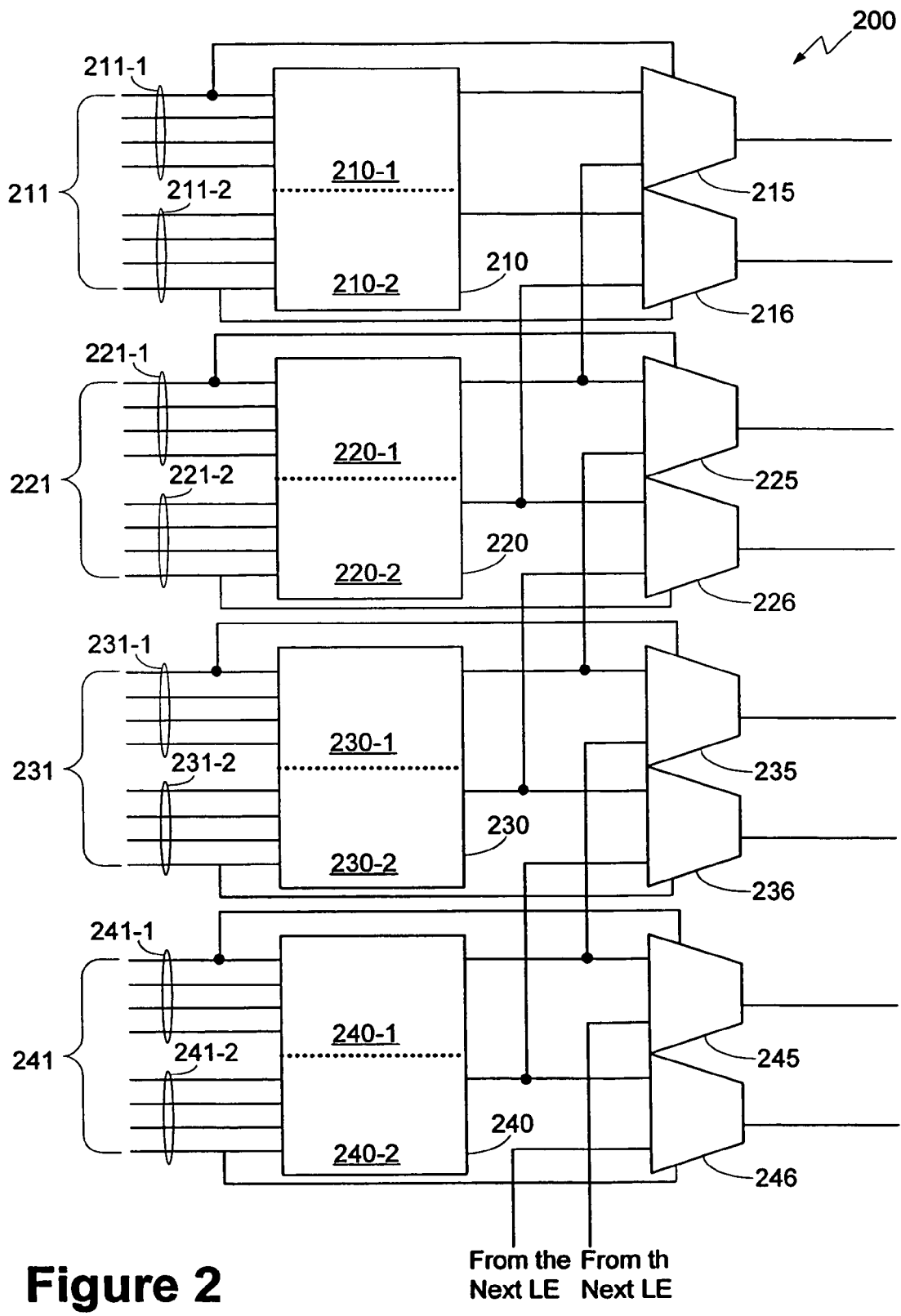
FIG. 2 is a block diagram of another embodiment of the logic circuit of the present invention.

FIG. 2 is a block diagram of another embodiment of the logic circuit of the present invention. In FIG. 2, logic circuit 200 includes LEs 210, 220, 230, and 240 and multiplexers 215, 216, 225, 226, 235, 236, 245, and 246. Each of LEs 210, 220, 230, and 240 is an eight input LE. LEs 210, 220, 230, and 240 receive signals on LE input terminals 211, 221, 231, and 241, respectively. LE input terminals 211 include LE input terminals 211-1 and 211-2. LE input terminals 221 include LE input terminals 221-1 and 221-2. LE input terminals 231 include LE input terminals 231-1 and 231-2. LE input terminals 241 include LE input terminals 241-1 and 241-2. There are two 2:1 multiplexers associated with each of LEs 210, 220, 230, and 240. LE 210 is coupled to the two 2:1 multiplexers associated therewith, i.e., multiplexers 215 and 216. Each of LEs 220, 230, and 240 is coupled to four 2:1 multiplexers.

In one embodiment each of LEs 210, 220, 230, and 240 includes a 6-input LUT that is fracturable. In one embodiment, each 6-input LUT includes two 5-input LUTs, each of which in turn includes two 4-input LUTs. In FIG. 2, two of the 4-input LUTs included in LE 210 are represented by reference numbers 210-1 and 210-2. Similarly, two of the 4-input LUTs included in LE 220 are represented by reference numbers 220-1 and 220-2, two of the 4-input LUTs included in LE 230 are represented by reference numbers 230-1 and 230-2, and two of the 4-input LUTs includes in LE 240 are represented by reference numbers 240-1 and 240-2.

Each 6-input LUT can function as a 4:1 multiplexer. Similarly, each 4-input LUT can function as a 2:1 multiplexer. In logic circuit 200, each of LEs 210, 220, 230, and 240 can operate as one 4:1 multiplexer using the 6-input LUT or as two 2:1 multiplexers using two of the 4-input LUTs that are a part of the 6-input LUT.

In LE 210, 4-input LUTs 210-1 and 210-2 receive signals on input terminals 211-1 and 211-2, respectively. In LE 220, 4-input LUTs 220-1 and 220-2 receive signals on input terminals 221-1 and 221-2, respectively. In LE 230, 4-input LUTs 230-1 and 230-2 receive signals on input terminals 231-1 and 231-2, respectively. In LE 240, 4-input LUTs 240-1 and 240-2 receive signals on input terminals 241-1 and 241-2, respectively.

As noted above, in one embodiment, each of LEs 210, 220, 230, and 240 outputs two 2:1 multiplexing results. The two output signals from LE 210 are provided to the two 2:1 multiplexers 215 and 216. Multiplexers 215 and 216 receive their other input data signals from LE 220. A select input of multiplexer 215 is driven by one of inputs of LE 211-1 and a select input of multiplexer 216 is driven by one of inputs 211-2. The two output signals from LE 220 are also provided to the two 2:1 multiplexers 225 and 226 Multiplexers 225 and 226 receive their other input data signals from LE 230. A select input of multiplexer 225 is driven by one of inputs 221-1 and a select input of multiplexer 226 is driven by one of inputs 221-2. The two output signals from LE 230 are also provided to the two 2:1 multiplexers 235 and 236. Multiplexers 235 and 236 receive their other input data signals from LE 240. A select input of multiplexer 235 is driven by one of inputs 231-1 and a select input of multiplexer 236 is driven by one of inputs LE 231-2. The two output signals from LE 240 are also provided to the two 2:1 multiplexers 245 and 246. Multiplexers 245 and 246 receive their other input data signals from an LE (not shown) below LE 240. A select input of multiplexer 245 is driven one of inputs 241-1 and a select input of multiplexer 246 is driven by one of inputs 241-2. In one embodiment, the select inputs of multiplexers 215, 216, 225, 226, 235, 236, 245 and 246 are hardwired to the respective LE input driving each select input.

In one embodiment, when each of LEs 210, 220, 230, and 240 provides two 2:1 multiplexing results, each of multiplexers 215, 216, 225, 226, 235, 236, 245, and 246 outputs a 4:1 multiplexing result. In order to obtain 8:1 multiplexing results, the eight output signals from multiplexers 215, 216, 225, 226, 235, 236, 245, and 246 are fed into a set of four 2:1 multiplexers. Alternatively, they are fed into two LEs similar to LE 220, for example, where each LE is configured as two 2:1 multiplexers. In order to obtain 16:1 multiplexing results, the eight output signals from multiplexers 215, 216, 225, 226, 235, 236, 245, and 246 are fed into two LEs similar to LE 220, for example, which is configured as a 4:1 multiplexer.

As noted above, each of LEs 210, 220, 230, and 240 can operate as a 4:1 multiplexer using a 6-input LUT therein. When each of LEs 210, 220, 230, and 240 provides a 4:1 multiplexing result, each of multiplexers 215, 216, 225, 226, 235, 236, 245, and 246 outputs a 8:1 multiplexing result. Since a traditional N:1 multiplexer does not share data signals not all multiplexer outputs can generate 8:1 multiplexing at the same time. Either multiplexer 215 or 216 can use LEs 210 and 220 to generate an 8:1 multiplexer. Either multiplexer 225 or 226 can use LEs 220 and 230 to generate an 8:1 multiplexer. Either multiplexer 235 or 236 can use LEs 230 and 240 to generate an 8:1 multiplexer. Either multiplexer 245 or 246 can use LEs 240 and the next LE not shown to generate an 8:1 multiplexer. In order to obtain 16:1 multiplexing results, the two output signals of independent 8:1 multiplexers are fed into a 2:1 multiplexer. For example, the outputs of multiplexers 215 and 235 or multiplexers 216 and 236 are fed into a 2:1 multiplexer. Alternatively, they are fed into an LE similar to LE 320, for example, where the LE is configured as a 2:1 multiplexer. In order to obtain 32:1 multiplexing results, the four output signals from either multiplexers 215, 225, 235 and 245 or multiplexers 216, 226, 236 and 246, are fed into a single LEs similar to LE 220, for example, which is configured as a 4:1 multiplexer.

It is to be noted that when operating as a 4:1 multiplexer, logic circuit 200 also acts as a four bit barrel shifter. When implementing a shift by 4 barrel shifter, each LE 210, 220, 230 and 240 is configured as two 2:1 multiplexers and all eight of the outputs of multiplexers 215, 216, 225, 226, 235, 236, 245 and 246 are used. Similarly, when operating as a 8:1 multiplexer, logic circuit 200 also acts as an eight bit barrel shifter. When implementing a shift by 8 barrel shifter in logic circuit 200, each LE 210, 220, 230 and 240 is configured as a 4:1 multiplexer and either 2:1 multiplexers 215, 225, 235 and 245 or 2:1 multiplexers 216, 225, 235 and 245 are used. To implement a shift by 16 barrel shifter, each LE 210, 220, 230 and 240 is configured as two 2:1 multiplexers and all eight 2:1 multiplexers 215, 216, 225, 226, 235, 236, 245 and 246 can, for example, drive two LEs similar to LE 220 where each LE is configured as a 4:1 multiplexer. In a similar manner, logic circuit 200, with additional LEs and multiplexers arranged as those shown in FIG. 2, may provide thirty-two, or sixty-four bit barrel shifting. It is to be noted that logic circuit 200 provides improved efficiency, in terms of density, over prior art circuits for barrel shifting.

Similarly, logic circuit 200 provides for crossbarring by four, eight, and sixteen bits. In particular for four bit cross-barring, each LE 210, 220, 230 and 240 is configured as a 2:1 multiplexer and all eight of the outputs of multiplexers 215, 216, 225, 226, 235, 236, 245 and 246 are used. When implementing 8 bit cross-barring, each LE 210, 220, 230 and 240 is configured as a 4:1 multiplexer and either 2:1 multiplexers 215, 225, 235 and 245 or 2:1 multiplexers 216, 225, 235 and 245 are used. When implementing 16 bit cross-barring each LE 210, 220, 230 and 240 is configured as a 4:1 multiplexer and either 2:1 multiplexers 215, 225, 235 and 245 or 2:1 multiplexers 216, 225, 235 and 245, can, for example, drive two LEs similar to LE 220 where each LE is configured as a 4:1 multiplexer. In a similar manner, logic circuit 200, with additional LEs and multiplexers arranged as those shown in FIG. 2 can also implement 32 bit and 64 bit cross-barring.

Figure 3:
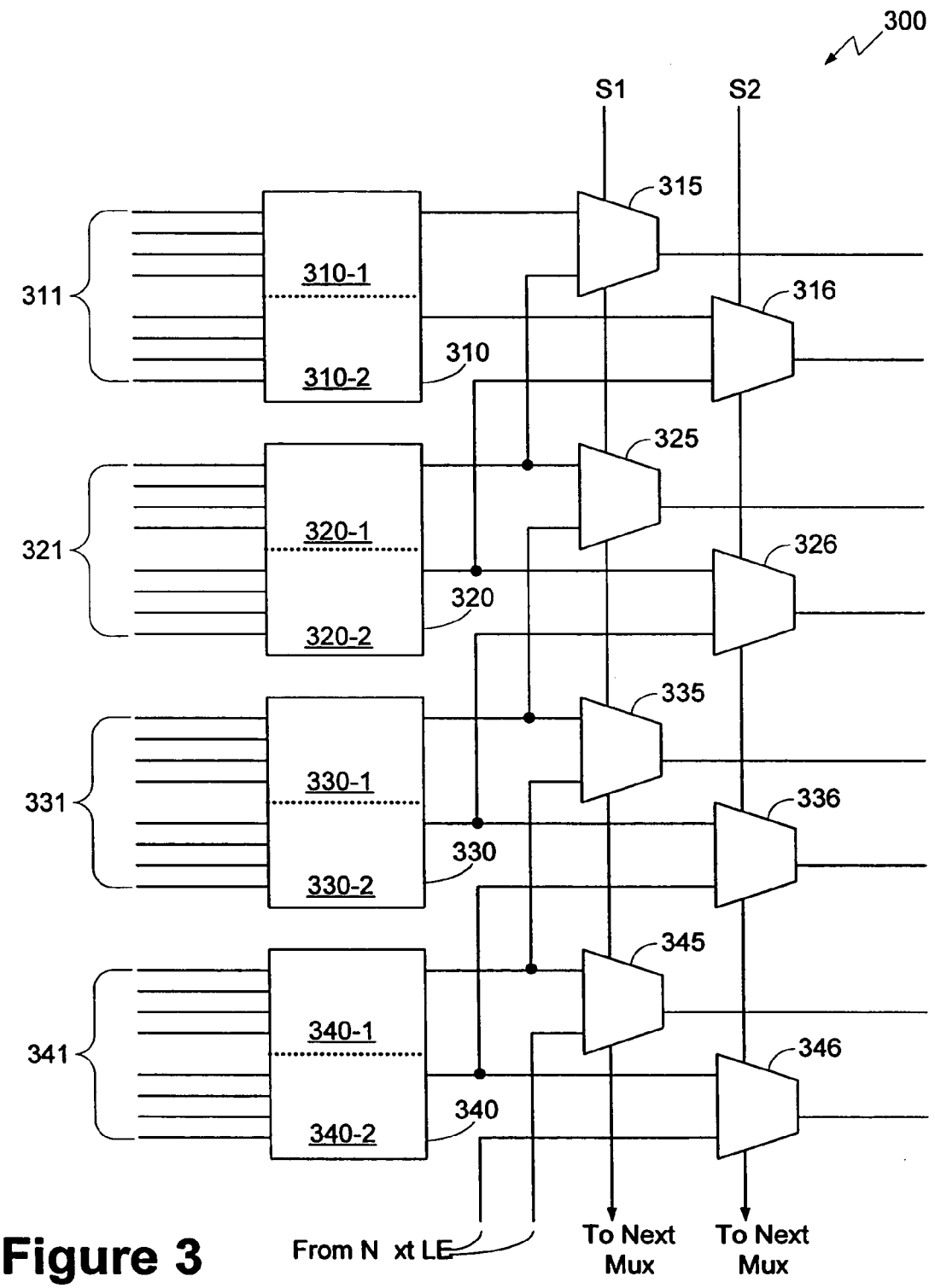
FIG. 3 is a block diagram of yet another embodiment of the logic circuit of the present invention.

FIG. 3 is a block diagram of yet another embodiment of the logic circuit of the present invention. In FIG. 3, logic circuit 300 includes LEs 310, 320, 330, and 340 and multiplexers 315, 316, 325, 326, 335, 336, 345, and 346.

In one embodiment, each of LEs 310, 320, 330, and 340 is an eight input LE. LEs 310, 320, 330, and 340 receive signals on LE input terminals 311, 321, 331, and 341, respectively. In one embodiment each of LEs 310, 320, 330, and 340 includes a 6-input LUT that is fracturable. In one embodiment, each 6-input LUT includes two 5-input LUTs, each of which in turn includes two 4-input LUTs. In FIG. 3, two of the 4-input LUTs included in LE 310 are represented by reference numbers 310-1 and 310-2. Similarly, two of the 4-input LUTs included in LE 320 are represented by reference numbers 320-1 and 320-2, two of the 4-input LUTs included in LE 330 are represented by reference numbers 330-1 and 330-2, and two of the 4-input LUTs included in LE 340 are represented by reference numbers 340-1 and 340-2. Also in one embodiment, each of multiplexers 315, 316, 325, 326, 335, 336, 345, and 346 is a 2:1 multiplexer.

There are two 2:1 multiplexers associated with each of LEs 310, 320, 330, and 340. LE 316 is coupled to the two 2:1 multiplexers associated therewith, i.e., multiplexers 315 and 316. Each of LEs 320, 330, and 340 is coupled to four 2:1 multiplexers.

In one embodiment, each of LEs 310, 320, 330, and 340 outputs two multiplexing results. The two output signals from LE 310 are provided to the two 2:1 multiplexers 315 and 316. Multiplexers 315 and 316 receive their other input data signals from LE 320. The two output signals from LE 320 are also provided to the two 2:1 multiplexers 325 and 326. Multiplexers 325 and 326 receive their other input data signals from LE 330. The two output signals from LE 330 are also provided to the two 2:1 multiplexers 335 and 336. Multiplexers 335 and 336 receive their other input data signals from LE 340. The two output signals from LE 340 are also provided to the two 2:1 multiplexers 345 and 346. Multiplexers 345 and 346 receive their other input data signals from an LE (not shown) below LE 340. Multiplexers 315, 325, 335, and 345 receive the select signal S1 as their select signal, while multiplexers 316, 326, 336, and 346 receive the select signal S2 as their select signal. In one embodiment, select signals S1 and S2 are LAB-wide select signals. In other words, all the logic circuits within a LAB receive the same select signals S1 and S2.

As noted above, in logic circuit 300, multiplexers 315, 325, 335, and 345 receive select signal S1, while multiplexers 316, 326, 336, and 346 receive select signal S2. It is to be noted that select signals S1 and S2 are not received from LE input terminals. This constitutes one of the main differences between logic circuits 200 and 300. As the select signals for the multiplexers 315, 316, 325, 326, 335, 336, 345, and 346 are not received from the LE input terminals, each LE in logic circuit 300 has two more LE input terminals available for receiving an independent signals than its counterpart LE in logic circuit 200.

As LEs in logic circuit 300 have a greater number of LE input terminals available than their counterparts in logic circuit 200, they provide greater flexibility than their counterparts in logic circuit 200. In logic circuit 300, as each LE has eight input terminals, it can provide two different 4:1 multiplexing results by using four of its input terminals for receiving data signals and four of the remaining input terminals to receive two different sets of select signals for selecting from the four data signals. With one set of two select signals, the LE 310 provides a first 4:1 multiplexing result, while with the other set of two select signals, it provides a second, separate 4:1 multiplexing result. As noted above, each of LEs 310, 320, 330, and 340 includes a 6-input fracturable LUT that includes four 4-input LUTs. In one embodiment, LEs of logic circuit 300 use a SLM to provide two separate 4:1 multiplexing results. A SLM is described in greater detail in U.S. patent application Ser. No. 10/351,026, which was filed on Jan. 24, 2003, is entitled "Logic Circuitry With Shared Lookup Table", and is incorporated herein by reference in its entirety.

When each of LEs 310, 320, 330, and 340 provides 4:1 multiplexing results, each of multiplexers 315, 316, 325, 326, 335, 336, 345, and 346 outputs a 8:1 multiplexing result. Since a traditional N:1 multiplexer does not share data signals not all multiplexer outputs can generate 8:1 multiplexing at the same time. Either multiplexer 315 or 316 can use LEs 310 and 320 to generate an 8:1 multiplexer. Either multiplexer 325 or 326 can use LEs 320 and 330 to generate an 8:1 multiplexer. Either multiplexer 335 or 336 can use LEs 330 and 340 to generate an 8:1 multiplexer. Either multiplexer 345 or 346 can use LEs 340 and the next LE not shown to generate an 8:1 multiplexer. In order to obtain 16:1 multiplexing results, the two output signals of independent 8:1 multiplexers are fed into a 2:1 multiplexer. For example multiplexers 315 and 335 or multiplexers 316 and 336 are fed into a 2:1 multiplexer. Alternatively, they are fed into an LE similar to LE 320, for example, where the LE is configured as a 2:1 multiplexer. In order to obtain 32:1 multiplexing results, the four output signals from either multiplexers 315, 325, 335, and 345 or 316, 326, 336, and 346 are fed into two LEs similar to LE 320, for example, where each LE includes a 4:1 multiplexer.

It is also to be noted that logic circuit 300, with additional LEs and multiplexers arranged as those shown in FIG. 3, may provide barrel shifting. To implement a 4 bit barrel shifter, each LE 310, 320, 330 and 340 is configured as two 2:1 multiplexers and all eight of the outputs of multiplexers 315, 316, 325, 326, 335, 336, 345 and 346 are used. Similarly, when operating as a 8:1 multiplexer, logic circuit 300 also acts as an eight bit barrel shifter. When implementing a shift by 8 barrel shifter in logic circuit 300, each LE 310, 320, 330 and 340 is configured as a 4:1 multiplexer and either 2:1 multiplexers 315, 325, 335 and 345 or 2:1 multiplexers 316, 325, 335 and 345 are used. To implement a shift by 16 barrel shifter, each LE 310, 320, 330 and 340 is configured as two 2:1 multiplexers and all eight of the outputs of multiplexers 315, 316, 325, 326, 335, 336, 345 and 346, can, for example, drive two LEs similar to LE 320 where each LE is configured as a 4:1 multiplexer. In a similar manner, logic circuit 300, with additional LEs and multiplexers arranged as those shown in FIG. 3, may provide thirty-two, or sixty-four bit barrel shifting.

Similarly, logic circuit 300 provides for cross-barring. Because each LE 310, 320, 330 or 340 can implement two 6-LUTs with 4 shared inputs and 2 independent inputs each, 4×2 cross-barring can be implements in each LE 310, 320, 330 and 340. To implement 8×2 cross-barring LEs 310 and 320 are each configured as a 4×2 crossbar and outputs are taken from multiplexers 315 and 316. A second 8×2 crossbar can also be implemented by configuring LEs 330 and 340 as 4×2 crossbars and taking outputs from multiplexers 335 and 336. To implement 16×2 cross-barring two 8×2 cross-bars are implemented as above, each LE 310, 320, 330 and 340 is configured as a 4×2 crossbar and outputs can be taken from multiplexers 315, 316, 335 and 336. The outputs of multiplexers 315 and 335 are connected to a 2:1 multiplexer and the outputs of multiplexers 316 and 336 are connected to a 2:1 multiplexer. The two 2:1 multiplexers can be implemented in a LE similar to LE 310. In a similar manner, logic circuit 300, with additional LEs and multiplexers arranged as those shown in FIG. 3, may provide thirty-two, or sixty-four bit cross-barring.

In another embodiment, logic circuit 300 can function in a manner identical to that described above for logic circuit 200 with the following exception. In such an embodiment of logic circuit 300, the select signals for the multiplexers 315, 316, 325, 326, 335, 336, 345, and 346 are received from the select signal lines instead of the LE input terminals of LEs 310, 320, 330, and 340.

Figure 4:
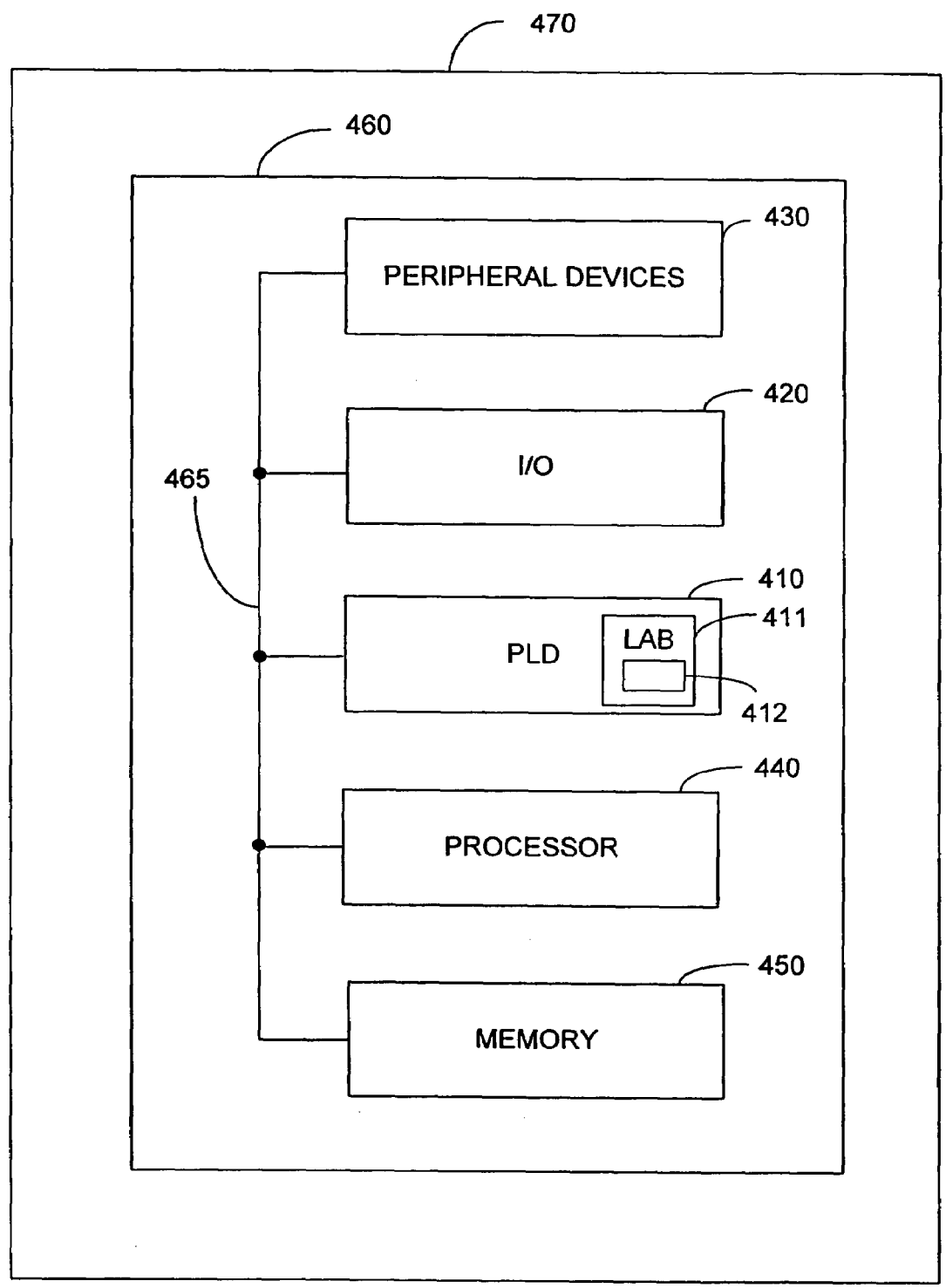
FIG. 4 illustrates an exemplary data processing system including an exemplary PLD in which logic circuits in accordance with the present invention might be implemented.

FIG. 4 illustrates an exemplary data processing system including an exemplary PLD in which logic circuits in accordance with the present invention might be implemented.

FIG. 4 illustrates, by way of example, a PLD 410 in a data processing system 400. As one example, logic circuits of this invention may be implemented in LEs of PLDs such as PLD 410. PLD 410 includes a plurality of LABs such as LAB 411 (only one LAB is shown to avoid overcomplicating the drawing). LAB 411 includes one or more logic circuits, such as logic circuit 412 (only one logic circuit is shown to avoid overcomplicating the drawing). Logic circuit 412 may be one of logic circuits 100, 200, or 300 shown in FIG. 1, 2, or 3, respectively. In one embodiment, logic circuit 412 and LAB 411 are on the same die/chip as PLD 410. Data processing system 400 may include one or more of the following components: a processor 440; memory 450; input/output (I/O) circuitry 420; and peripheral devices 430. These components are coupled together by a system bus 465 and are populated on a circuit board 460 which is contained in an end-user system 470. A data processing system such as system 400 may include a single end-user system such as end-user system 470 or may include a plurality of systems working together as a data processing system.

System 400 can be used in a wide variety of applications, such as computer networking, data networking, instrumentation, video processing, DSP, or any other application where the advantage of using programmable or reprogrammable logic is desirable. PLD 410 can be used to perform a variety of different logic functions. For example, PLD 410 can be configured as a processor or controller that works in cooperation with processor 440 (or, in alternative embodiments, a PLD might itself act as the sole system processor). PLD 410 may also be used as an arbiter for arbitrating access to shared resources in system 400. In yet another example, PLD 410 can be configured as an interface between processor 440 and one of the other components in system 400. It should be noted that system 400 is only exemplary.

In one embodiment, system 400 is a digital system. As used herein a digital system is not intended to be limited to a purely digital system, but also encompasses hybrid systems that include both digital and analog subsystems.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the appended claims.

The invention claimed is:

1. A logic circuit comprising:
a plurality of logic blocks, each of the plurality of logic blocks including:
a first logic element (LE) including a first plurality of LE input terminals and a first LE output terminal of the first LE;
a second LE including a first LE output terminal of the second LE;
a first multiplexer including a first plurality of multiplexer input terminals and a first select terminal, wherein a first multiplexer input terminal of the first plurality of multiplexer input terminals is coupled to the first LE output terminal of the first LE, a second multiplexer input terminal of the first plurality of multiplexer input terminals is coupled to the first LE output terminal of the second LE, and the first select terminal is coupled to an LE input terminal of the first plurality of LE input terminals;
a third logic element (LE) including a third plurality of LE input terminals and a first LE output terminal of the third LE;
a fourth LE including a first LE output terminal of the fourth LE; and
a second multiplexer including a second plurality of multiplexer input terminals and a second select terminal, wherein a first multiplexer input terminal of the second plurality of multiplexer input terminals is coupled to the first LE output terminal of the third LE, a second multiplexer input terminal of the second plurality of multiplexer input terminals is coupled to the first LE output terminal of the fourth LE, and the second select terminal is coupled to an LE input terminal of the third plurality of LE input terminals.

2. The logic circuit of claim 1, further comprising a third multiplexer, wherein the third multiplexer includes a third plurality of multiplexer input terminals and a third select terminal, wherein a first multiplexer input terminal of the third plurality of multiplexer input terminals is coupled to an output terminal of the first multiplexer, a second multiplexer input terminal of the third plurality of multiplexer input terminals is coupled to an output terminal of the second multiplexer, and the third select terminal is coupled to an LE input terminal of a plurality of input terminals of the second LE.

3. The logic circuit of claim 2, wherein each of the first, second, third, and fourth LEs includes a 6-input look-up-table (LUT) and functions as a 4:1 multiplexer.

4. The logic circuit of claim 2, wherein each of the first, second, and third multiplexers comprises a 2:1 multiplexer.

5. The logic circuit of claim 1, wherein the second LE includes a second plurality of LE input terminals, the logic circuit further comprising:
a third LE including first and second LE output terminals of the third LE;
a third multiplexer including a third plurality of multiplexer input terminals and a third select terminal, wherein a first multiplexer input terminal of the third plurality of multiplexer input terminals is coupled to the first LE output terminal of the second LE, a second multiplexer input terminal of the third plurality of multiplexer input terminals is coupled to the first LE output terminal of the third LE, and the third select terminal is coupled to a first LE input terminal of the second plurality of LE input terminals; and
a fourth multiplexer including a fourth plurality of multiplexer input terminals and a fourth select terminal, wherein a first multiplexer input terminal of the fourth plurality of multiplexer input terminals is coupled to the second LE output terminal of the second LE, a second multiplexer input terminal of the fourth plurality of multiplexer input terminals is coupled to the second LE output terminal of the third LE, and the fourth select terminal is coupled to a second LE input terminal of the second plurality of LE input terminal.

6. The logic circuit of claim 5, wherein each of the first, second, and third LEs includes two 4-input LUTs and functions as two separate 2:1 multiplexers.

7. The logic circuit of claim 5, wherein each of the first, second, and third LEs includes a 6-input LUT and functions as a 4:1 multiplexer.

8. The logic circuit of claim 5, wherein each of the first, second, third, and fourth multiplexers comprises a 2:1 multiplexer.

9. A programmable logic device including the logic circuit of claim 1.

10. A digital system comprising a programmable logic device including the logic circuit of claim 1.

11. A logic device comprising:
a plurality of logic blocks, each of the plurality of logic blocks including:
a first logic element (LE) including a first plurality of LE input terminals, a first LE output terminal of the first LE, and a second LE output terminal of the first LE;
a second LE including a second plurality of LE input terminals, a first LE output terminal of the second LE, and a second LE output terminal of the second LE;
a first multiplexer including a first plurality of multiplexer input terminals and a first select terminal, wherein a first multiplexer input terminal of the first plurality of multiplexer input terminals is coupled to the first LE output terminal of the first LE, a second multiplexer input terminal of the first plurality of multiplexer input terminals is coupled to the first LE output terminal of the second LE, and the first select terminal is coupled to a first select signal line;
a second multiplexer including a second plurality of multiplexer input terminals and a second select terminal wherein a first multiplexer input terminal of the second plurality of multiplexer input terminals is coupled to the second LE output terminal of the first LE, a second multiplexer input terminal of the second plurality of multiplexer input terminals is coupled to the second LE output terminal of the second LE, and the second select teal is coupled to a second select signal line,
a third LE including a third plurality of LE input terminals, a first LE output terminal of the third LE, and a second LE output terminal of the third LE;
a third multiplexer including a third plurality of multiplexer input terminals and a third select terminal, wherein a first multiplexer input terminal of the third plurality of multiplexer input terminals is coupled to the first LE output terminal of the second LE, a second multiplexer input terminal of the third plurality of multiplexer input terminal is coupled to the first LE output terminal of the third LE, and the third select terminal is coupled to the first select signal line; and
a fourth multiplexer including a fourth plurality of multiplexer input terminals and a fourth select terminal, wherein a first multiplexer input terminal of the fourth plurality of multiplexer input terminals is coupled to the second LE output terminal of the second LE, a second multiplexer input terminal of the fourth plurality of multiplexer input terminals is coupled to the second LE output terminal of the third LE, and the fourth select terminal is coupled to the second select signal line.

12. The logic circuit of claim 11, wherein the first LE includes a 6-input look-up-table (LUT) that includes a shared LUT mask (SLM) and provides two separate 4:1 multiplexing results.

13. The logic circuit of claim 11, wherein the first and second select signal lines are logic array block (LAB)-wide select lines, further wherein the first and second select signal lines carry first and second select signals, respectively.

14. The logic circuit of claim 11, wherein each of the first and second multiplexers comprises a 2:1 multiplexer.

15. The logic circuit of claim 11, wherein the third LE includes a 6-input look-uptable (LUT) that includes a shared LUT mask (SLM) and provides two separate 4:1 multiplexing results.

16. The logic circuit of claim 15, wherein each of the third and fourth multiplexers comprises a 2:1 multiplexer.

17. A programmable logic device including the logic circuit claim 11.

18. A digital system comprising a programmable logic device including the logic circuit of claim 11.

19. A method of multiplexing a plurality of data input signals in a logic block, the method comprising:
receiving in the logic block a first plurality of data input signals of the plurality of data input signals on a first plurality of logic element (LE) input terminals of a first LE;
multiplexing in the logic block the first plurality of data input signals in the first LE;
receiving in the logic block a second plurality of data input signals of the plurality of data input signals on a first plurality of logic element (LE) input terminals of a second LE;
multiplexing in the logic block the second plurality of data input signals in the second LE; multiplexing outputs of the first and second LEs in a first multiplexer, wherein the first multiplexer receives a select signal from an LE input terminal of the first LE;
receiving in the logic block a third plurality of data input signals of the plurality of data input signals on a first plurality of LE input teals of a third LE;
multiple in the logic block the third plurality of data input signals in the third LE;
receiving in the logic block a fourth plurality of data input signals of the plurality of data input signals on a first plurality of LE input terminals of a fourth LE; and
multiplexing in the logic block the fourth plural of data input signals in the fourth LE; and multiplexing outputs of the third and fourth LEs in a second multiplexer, wherein the second multiplexer receives a select signal from an LE input terminal of the third LE.

20. The method of claim 19 further comprising:
multiplexing outputs of the first and second multiplexers in a third multiplexer, wherein the third multiplexer receives a select signal from an LE input terminal of the second LE.

21. The method of claim 19 further comprising:
receiving a third plurality of data input signals of the plurality of data input signals on a second plurality of LE input terminals of the first LE;
multiplexing the third plurality of data input signals in the first LE;
receiving a fourth plurality of data input signals of the plurality of data input signals on a second plurality of LE input terminals of the second LE;
multiplexing the fourth plurality of data input signals in the second LE;
multiplexing in a second multiplexer a result of multiplexing the third plurality of data input signals in the first LE and a result of multiplexing the fourth plurality of data input signals in the second LE, wherein the second multiplexer receives a select signal from the LE input terminal of the first LE.

22. A method of multiplexing a plurality of data input signals, the method comprising:
receiving a first plurality of data input signals of the plurality of data input signals on a first plurality of logic element (LE) input terminals of a first LE;
first multiplexing the first plurality of data input signals in the first LE using a first set of select signals;
second multiplexing the first plurality of data input signals in the first LE using a second set of select signals;
receiving a second plurality of data input signals of the plurality of data input signals on a first plurality of LE input terminals of a second LE;
first multiplexing the second plurality of data input signals in the second LE using a third set of select signals;
second multiplexing the second plurality of data input signals in the second LE using a fourth set of select signals;
multiplexing in a first multiplexer results of the first multiplexing in the first LE and of the first multiplexing in the second LE, wherein the first multiplexer receives a select signal from a first select signal line; and
multiplexing in a second multiplexer results of the second multiplexing in the first LE and of the second multiplexing in the second LE, wherein the second multiplexer receives a select signal from a second select signal line.

23. The method of claim 22, wherein the first and second select signal lines are logic array block (LAB)-wide select signal lines.

* * * * *